United States Patent
Borisov et al.

(10) Patent No.: US 11,342,789 B2
(45) Date of Patent: May 24, 2022

(54) DETECTING HOT SOCKET CONDITIONS IN UTILITY ELECTRICITY METERS

(71) Applicant: ITRON, INC., Liberty Lake, WA (US)

(72) Inventors: Vladimir Borisov, Seneca, SC (US); Matthieu Pichot, Paris (FR)

(73) Assignee: ITRON, INC., Liberty Lake, WA (US)

( * ) Notice: Subject to any disclaimer, the term of this patent is extended or adjusted under 35 U.S.C. 154(b) by 1 day.

(21) Appl. No.: 16/869,509

(22) Filed: May 7, 2020

(65) Prior Publication Data

US 2021/0351614 A1 Nov. 11, 2021

(51) Int. Cl.
*H02J 13/00* (2006.01)
*G01R 19/25* (2006.01)
*G06Q 50/06* (2012.01)

(52) U.S. Cl.
CPC .... *H02J 13/00034* (2020.01); *G01R 19/2513* (2013.01); *G06Q 50/06* (2013.01); *H02J 13/00002* (2020.01)

(58) Field of Classification Search
CPC .......... H02J 13/00034; H02J 13/00002; G06Q 50/06; G01R 19/2513
USPC ........................................................ 702/60
See application file for complete search history.

(56) References Cited

U.S. PATENT DOCUMENTS

| | | | |
|---|---|---|---|
| 5,223,795 A | 6/1993 | Blades | |
| 9,733,294 B2 | 8/2017 | Shuey et al. | |
| 10,054,631 B2 | 8/2018 | Lawton et al. | |
| 10,161,983 B2 | 12/2018 | Kraus et al. | |
| 2008/0061793 A1 | 3/2008 | Anwar et al. | |
| 2014/0172723 A1* | 6/2014 | Borisov | H04B 3/54 705/76 |
| 2014/0327449 A1* | 11/2014 | Shuey | G01R 22/068 324/538 |
| 2017/0170782 A1 | 6/2017 | Yoscovich et al. | |
| 2019/0120885 A1* | 4/2019 | Kraus | G01R 21/06 |
| 2021/0096158 A1* | 4/2021 | Kraus | H02H 1/0015 |
| 2021/0151974 A1 | 5/2021 | Borisov et al. | |

FOREIGN PATENT DOCUMENTS

WO 03/003324 A1 1/2003

OTHER PUBLICATIONS

International Search Report for application No. PCT/US2020/060850 dated Feb. 9, 2021.
Notice of Publication received for U.S. Appl. No. 16/688,989, dated May 20, 2021, 25 pages.

* cited by examiner

*Primary Examiner* — Michael P Nghiem
*Assistant Examiner* — Dacthang P Ngo
(74) *Attorney, Agent, or Firm* — Artegis Law Group, LLP (57) ABSTRACT

Various embodiments disclosed herein provide techniques for detecting hot socket conditions in an electrical system. A hot socket application executing on a utility electricity meter acquires, via a power line communications (PLC) modem, first signal readings associated with a utility electricity meter. The hot socket application acquires, via a radio frequency (RF) transceiver, second signal readings associated with the utility electricity meter. The hot socket application performs one or more operations on the first signal readings and the second signal readings to determine whether a hot socket condition is present. The hot socket application performs a remedial operation in response to determining that the one or operations indicate that the hot socket condition is present.

20 Claims, 8 Drawing Sheets

DETECTING HOT SOCKET CONDITIONS IN UTILITY ELECTRICITY METERS

BACKGROUND

Field of the Various Embodiments

The various embodiments relate generally to residential electrical systems and, more specifically, to detecting hot socket conditions in utility electricity meters.

Description of the Related Art

Electrical failures or malfunctions resulting from electrical arcing are a leading cause of fires in households and other building structures. Electrical arcing is characterized by an electric arc that produces a prolonged electrical discharge. When electrical arcing occurs in the connections of the utility electricity meter, the phenomenon is known as a "hot socket condition." Typically, the utility electricity meter is installed in a corresponding socket. The socket includes connectors that form a spring-like fit with corresponding terminals on the utility electricity meter. The tension of the socket connectors against the terminals of the utility electricity meter form connections between the utility power wiring, the electrical wiring of the household or structure, and the utility electricity meter. As electricity flows from the utility power wiring to the electrical wiring of the household or structure, the utility electricity meter measures the amount of power consumed for the purpose of billing the customer for usage of the power supplied by the utility.

Hot socket conditions can occur under certain conditions. The connectors on the socket and/or the terminals on the utility electricity meter may corrode or oxidize over time, thereby causing the connection to the utility electricity meter to be more resistive. Alternatively, the spring-like connectors on the socket may weaken over time, resulting in a weak or intermittently open connection to the corresponding terminals on the utility electricity meter. A hot socket condition may develop when the utility electricity meter is replaced, either due to failure or an upgrade to a new model. The older connectors on the socket may not form a good connection to the terminals on the new utility electricity meter, again due to corrosion, oxidization, or weak socket connectors. Further, the technician may install the new utility electricity meter incorrectly, resulting in poor connections to the socket. The high temperatures normally associated with a hot socket condition can cause related electrical fires that, in turn, can result in significant property damage and/or personal injury or death.

Because a hot socket condition results in high temperatures, one approach for detecting a hot socket connection is to measure the temperature in the utility electricity meter over a period of time. A rising temperature may indicate a hot socket condition. One drawback with this approach, however, is that the utility electricity meter may be placed in a location that receives sunlight and/or changes temperature with the ambient temperature. As a result, the temperature of the utility electricity meter may rise when the utility electricity meter is in sunlight or the ambient temperature increases, thereby resulting in false positives. This approach further requires one or more additional temperature sensors in the utility electricity meter or housing. For example, a typical utility electricity meter could include two temperature sensors per phase, where each temperature sensor has an isolation rating of 6 kV or higher.

Another approach for detecting a hot socket connection is to measure noise on the line current or, alternatively, to measure noise on the line voltage. If a consistent noise pattern on the line current over a period of time, such a noise pattern may be indicative of a hot socket condition. One drawback with this approach is that measuring noise patterns in the line current senses noise along the entire wiring circuit. Therefore, the noise pattern may be caused by a hot socket condition or from electrical arcing at an outlet or device located remotely from the utility electricity meter. Consequently, a hot socket condition is indistinguishable from electrical arcing at other, more distant locations in the circuit based on measurements of noise patterns in the line voltage or current.

Yet another approach for detecting a hot socket connection is to detect radio frequency (RF) signatures indicative of arcing conditions. These RF signatures are detectable via advanced spectral analysis and/or temporal analysis. However, additional specialized hardware, digital signal processing capability, and processing resources are typically needed in order to perform the analysis to detect such RF signatures. Such specialized hardware and processing resources results in a higher cost for the utility electricity meter.

As the foregoing illustrates, what is needed in the art are more effective ways of detecting hot socket conditions in an electrical system.

SUMMARY

Various embodiments include a computer-implemented method for detecting hot socket conditions in an electrical system. The method includes acquiring, via a power line communications (PLC) modem, first signal readings associated with a utility electricity meter. The method further includes acquiring, via a radio frequency (RF) transceiver, second signal readings associated with the utility electricity meter. The method further includes performing one or more operations on the first signal readings and the second signal readings to determine whether a hot socket condition is present. The method further includes performing a remedial operation in response to determining that the one or operations indicate that the hot socket condition is present.

Other embodiments include, without limitation, one or more non-transitory computer-readable media storing instructions for performing one or more aspects of the disclosed techniques, as well as a system for performing one or more aspects of the disclosed techniques.

At least one technical advantage of the disclosed techniques relative to the prior art is that hot socket conditions are detected with improved reliability relative to prior approaches. Because the disclosed techniques rely on detecting broadband noise, the techniques do not suffer from false positives resulting from temperature measurement approaches. Further, because the disclosed techniques involve detecting both PLC spectrum noise and RF spectrum noise, the techniques can distinguish hot socket conditions occurring at the utility electricity meter from arcing conditions occurring at other, more remote locations in the circuit. In particular, the magnitude of RF emissions produced by arcing is relatively low and becomes undetectable beyond a short distance from the utility electricity meter because of propagation loss. In addition, the disclosed techniques utilize existing PLC and RF circuitry along with relatively simple processing. Therefore, the techniques do not require specialized hardware or significant processing resources, such as is required to perform spectral and temporal analysis to detect RF signatures. These technical advantages represent one or more technological advancements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one of skilled in the art that the inventive concepts may be practiced without one or more of these specific details.

As further described herein, a site, such as a residential household or other structure, includes one or more utility meters, such as a utility electricity meter. In general, a residential household includes a single utility electricity meter. However, any given site may include any technically feasible number of utility electricity meters, within the scope of the disclosed embodiments. The utility electricity meters communicate with one another and with other devices via low-frequency power line communications (PLC). PLC enables the utility electricity meter to perform outbound communications to edge devices and to utility electricity meters at other sites over the power lines of the electrical system. The utility electricity meters also communicate with one another and with other devices via high-frequency radio frequency (RF) communications. As further described herein, the utility electricity meter device employs the PLC circuitry and the RF circuitry to continuously monitor, analyze, and correlate, as a background process, signals that are present in both the PLC spectrum and the RF spectrum. Correlated signals or noise that is present in both the PLC spectrum and the RF spectrum is indicative of a hot socket condition.

System Overview

Figure 1:
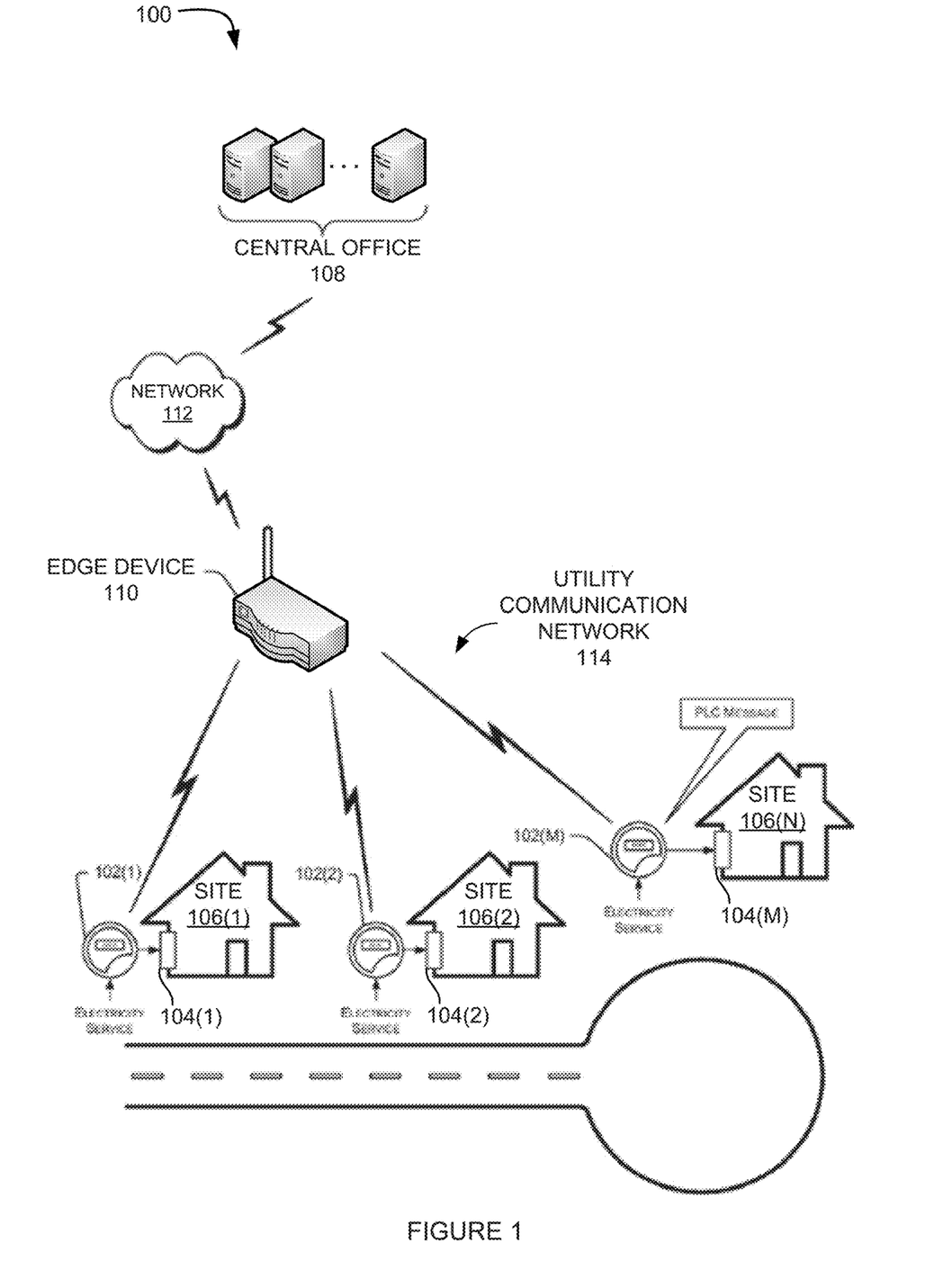
FIG. 1 illustrates a system configured to implement one or more aspects of the various embodiments.

FIG. 1 illustrates a system 100 configured to implement one or more aspects of the various embodiments. As shown, the system 100 includes a plurality of utility electricity meter 102(1), 102(2) ... 102(M), utility electricity meter sockets 104(1), 104(2) ... 104(M), a plurality of, a plurality of sites 106(1), 106(2) ... 106(N), a central office 108, and an edge device 110. Central office 108 communicates with edge device 110 via a network 112. Utility electricity meters 102(1), 102(2) ... 102(M) communicate with the edge device 110 and with other utility electricity meters 102(1), 102(2) ... 102(M) via PLC and/or radio frequency (RF) communications. Edge device 110 communicates with utility electricity meters 102(1), 102(2) ... 102(M) via a utility communication network 114. Each of the network 112 and the utility communication network 114 includes any technically feasible combination of a wide area network (WAN), metropolitan area network (MAN), local area network (LAN), neighborhood area network (NAN), personal area network (PAN), and/or the like.

The plurality of utility electricity meters 102(1), 102(2) ... 102(M) (collectively referred to as utility electricity meters 102) is associated with a plurality of sites 106(1), 106(2) ... 106(N) (collectively referred to as sites 106). M represents a number of utility electricity meters 102 in the utility communication network 114, where M is any integer greater than 0. N represents a number of individual sites 106 serviced by utility electricity meters 102 in the utility communication network 114, where N is any integer greater than 0. Each of the utility electricity meters 102(1), 102(2) ... 102(M) is inserted into a corresponding utility electricity meter socket 104(1), 104(2) ... 104(M) (collectively referred to as utility electricity meter sockets 104).

The number M of utility electricity meters 102 may or may not be equal to the number N of sites 106, because some sites 106 may include multiple utility electricity meters 102. Additionally or alternatively, some utility electricity meters 102 may serve multiple sites 106. The utility electricity meters 102 communicate with one another via PLC communications and/or RF communications. PLC communications enables each of the utility electricity meters 102 to perform low-frequency outbound communications over the power lines of the electrical system. RF communications enables each of the utility electricity meters 102 to perform high-frequency over-the-air communications. As further described herein, one or more of the utility electricity meters 102 employ the PLC circuitry and the RF circuitry to continuously monitor, analyze, and correlate, as a background process, the signals that are present in both the PLC spectrum and the RF spectrum. In that regard, the utility electricity meters 102 acquire first signal readings in the PLC spectrum that represent signals that are within a first frequency range. Further, the utility electricity meters 102 acquire second signal readings in the RF spectrum that represent signals that are within a second frequency range, where the second frequency range is higher than the first frequency range.

Correlated signals or noise that is present in both the PLC spectrum and the RF spectrum is indicative of a hot socket condition.

The utility electricity meters 102 are configured as, or in connection with, a variety of other computing devices including, without limitation, electricity meters, smart utility meters (e.g., electric, gas, and water meters), sensors (e.g., temperature sensors, weather stations, and frequency sensors, etc.), control devices, transformers, switches. The system 100 represents a heterogeneous network of utility electricity meters 102. In that regard, the system 100 includes any technically feasible combination of different types of utility electricity meters 102 (e.g., smart meters, cellular relays, sensors, etc.). Additionally or alternatively, the system 100 includes any technically feasible combination of different generations or models of utility electricity meters 102. Additionally or alternatively, the system 100 includes any technically feasible combination of utility electricity meters 102 that are capable of transmitting on different channels and using different modulation techniques, data rates, protocols, signal strengths, and/or power levels.

The utility electricity meters 102 are configured to communicate with a central office 108 via an edge device 110 that serves as a connection point to one or more backhaul networks 112, such as the Internet. The edge device 110 includes any one or more of a data collector, a cellular relay, a cellular router, an edge router, and a destination oriented directed acyclic graph (DODAG) root.

The utility communication network 114 is configurable as a "star network" in which the utility electricity meters 102 communicate directly with the edge device 110 (as shown). Additionally or alternatively, the utility communication network 114 is configurable as a "mesh network" in which the utility electricity meters 102 communicate with the edge device 110 either directly or via one or more intervening upstream devices (not shown). In this regard, the architecture of the system 100 of FIG. 1 is generically representative of either a star network or a mesh network.

Figures 2A, 2B:
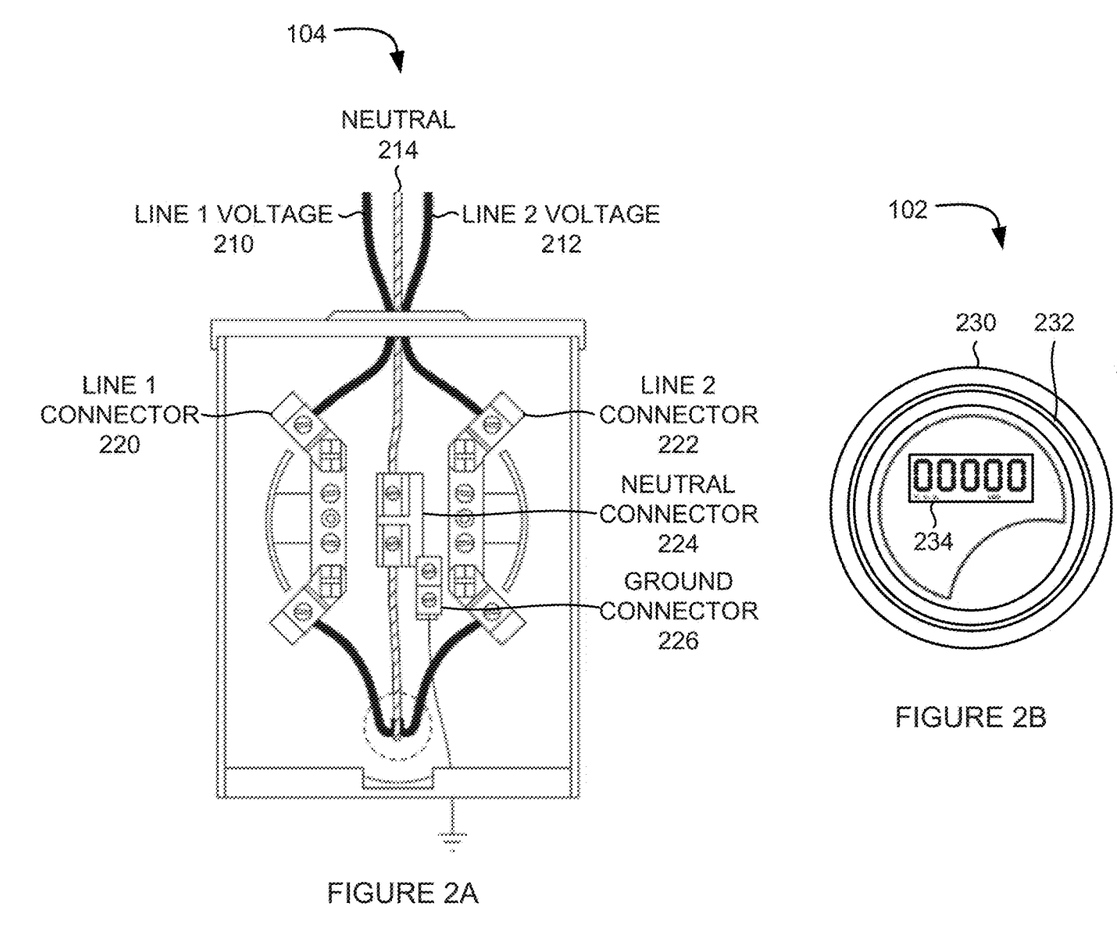
FIGS. 2A-2C illustrates more detailed view of one the utility electricity meter sockets and utility electricity meters of FIG. 1, according to various embodiments.
Figure 2C:
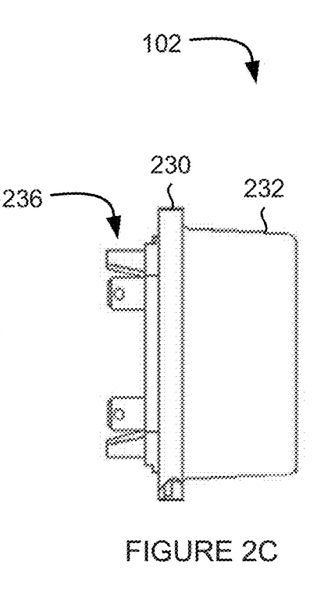

FIGS. 2A-2C illustrates more detailed view of one the utility electricity meter sockets 104 and utility electricity meters 102 of FIG. 1, according to various embodiments. More specifically, FIG. 2A illustrates a front view of a utility electricity meter socket 104, FIG. 2B illustrates a front view of a utility electricity meter 102, and FIG. 2C illustrates a side view of the utility electricity meter 102.

As shown in FIG. 2A, a utility electricity meter socket 104 supplies line 1 voltage 210, line 2 voltage 212, and neutral 214 to the utility electricity meter 102. Line 1 voltage 210, line 2 voltage 212, and neutral 214 may be any technically feasible voltage level. In some embodiments, the voltage difference between line 1 voltage 210 and line 2 voltage 212 may be in the range of 220 V to 240 V. In such embodiments, the difference between neutral and either line 1 voltage 210 or line 2 voltage 212 may be 110 V to 120 V. The utility electricity meter socket 104 includes various connectors that connect to corresponding terminals 236 on the utility electricity meter 102. In particular, the line 1 connector 220 connects to terminals 236 on the utility electricity meter 102 that are associated with the line 1 voltage 210. Similarly, the line 2 connector 222 connects to terminals 236 on the utility electricity meter 102 that are associated with the line 2 voltage 212. The neutral connector 224 connects to terminals 236 on the utility electricity meter 102 that are associated with neutral 214. Further, the ground connector 226 connects the utility electricity meter socket 104 to earth ground. When inserted into the utility electricity meter socket 104, the terminals 236 on the utility electricity meter 102 connect to corresponding connectors on the utility electricity meter socket 104. In this manner, the utility electricity meter 102 monitors power consumption on the line 1 voltage 210 and line 2 voltage 212 connections.

As shown in FIGS. 2B and 2C, the utility electricity meter 102 includes a mounting flange 230 that abuts the front surface of the utility electricity meter socket 104 when the utility electricity meter 102 is installed. The utility electricity meter 102 further includes a housing 232 that protects the mechanical and electrical components of the utility electricity meter 102 from rain, snow, physical impact, and/or the like. The utility electricity meter 102 includes a multifunction display 234 that displays various metrics, such as the voltage level of one or both of the line 1 voltage 210 or the line 2 voltage 212, the current draw on one or both of the line 1 voltage 210 or the line 2 voltage 212, power consumption associated with one or both of the one or both of the line 1 voltage 210 or the line 2 voltage 212, and/or the like. Various terminals 236 connect with corresponding connectors on the utility electricity meter socket 104.

Figure 3:
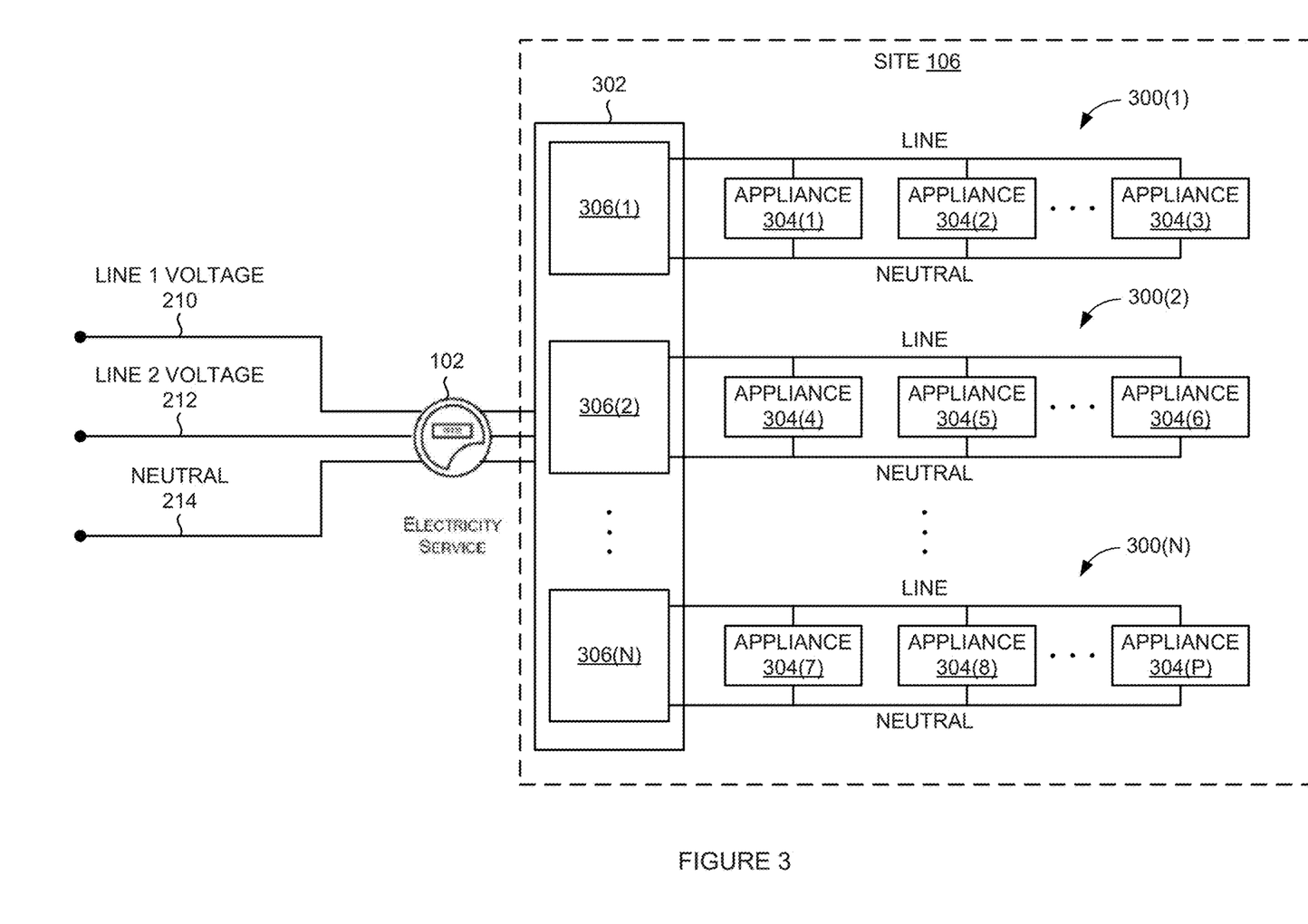
FIG. 3 illustrates a more detailed view of one of the sites of FIG. 1, according to various embodiments.

FIG. 3 illustrates a more detailed view of one of the sites 106 of FIG. 1, according to various embodiments. As shown, a utility electricity meter 102 receives line 1 voltage 210, line 2 voltage 212, and neutral 214. Line 1 voltage 210, line 2 voltage 212, and neutral 214 may be any technically feasible voltage level. In some embodiments, the voltage difference between line 1 voltage 210 and line 2 voltage 212 may be in the range of 220 V to 240 V. In such embodiments, the difference between neutral and either line 1 voltage 210 or line 2 voltage 212 may be 110 V to 120 V. The utility electricity meter 102 couples line 1 voltage 210, line 2 voltage 212, and neutral 214 to a circuit breaker panel 302. The circuit breaker panel 302 may include any technically feasible number of circuit breakers 306(1), 306(2) . . . 306(P), such as 10 circuit breakers, 20 circuit breakers, 50 circuit breakers, or more, depending on the size and complexity of the site 106. Each circuit breaker 306(1), 306(2) . . . 306(P) is coupled to a corresponding electrical circuit 300(1), 300(2) . . . 300(P). As shown, each electrical circuit 300(1), 300(2) . . . 300(P) is coupled with and supplies electricity to one or more appliances 304(1), 304(2) . . . 304(P). The appliances 304 are representative of any devices that are plugged in, directly wired in, or otherwise coupled to the electrical circuit 300. Appliances can include, without limitation, kitchen appliances, lamps, space heaters, and vacuum cleaners. Typically, the circuit breaker panel 302 and the electrical circuits 300(1), 300(2) . . . 300(P) also have a connection to safety ground, however, the safety ground connection is not shown in FIG. 2 for the sake of clarity. In some cases, some appliance may be connected between two lines rather than between a single line and ground, however, this is not shown in FIG. 2 for the sake of clarity.

As further described herein, the utility electricity meter 102 includes communication technologies, such PLC and RF communications. Via PLC communications and/or RF communications, the utility electricity meter 102 transmits messages to and receives messages from the edge device 110 and/or other utility electricity meters 102 connected to the edge device 110. As further described herein, the utility electricity meter 102 employs the PLC circuitry and the RF circuitry to continuously monitor, analyze, and correlate, as a background process, the signals present in both the PLC spectrum and the RF spectrum. Correlated signals or noise that is present in both the PLC spectrum and the RF spectrum is indicative of a hot socket condition. The utility electricity meter 102 detects hot socket conditions between connectors on the utility electricity meter socket 104 and corresponding terminals on the utility electricity meter 102. In so doing, the hot socket application 464 detects line-to-line signal readings between a first line voltage signal and a second line voltage signal. Additionally or alternatively, the hot socket application 464 detects signal readings between a neutral signal and either of the line voltage signals and/or currents in any of the line voltage lines, including, without limitation, metrology signals.

Detecting Hot Socket Conditions in an Electrical System

Figure 4:
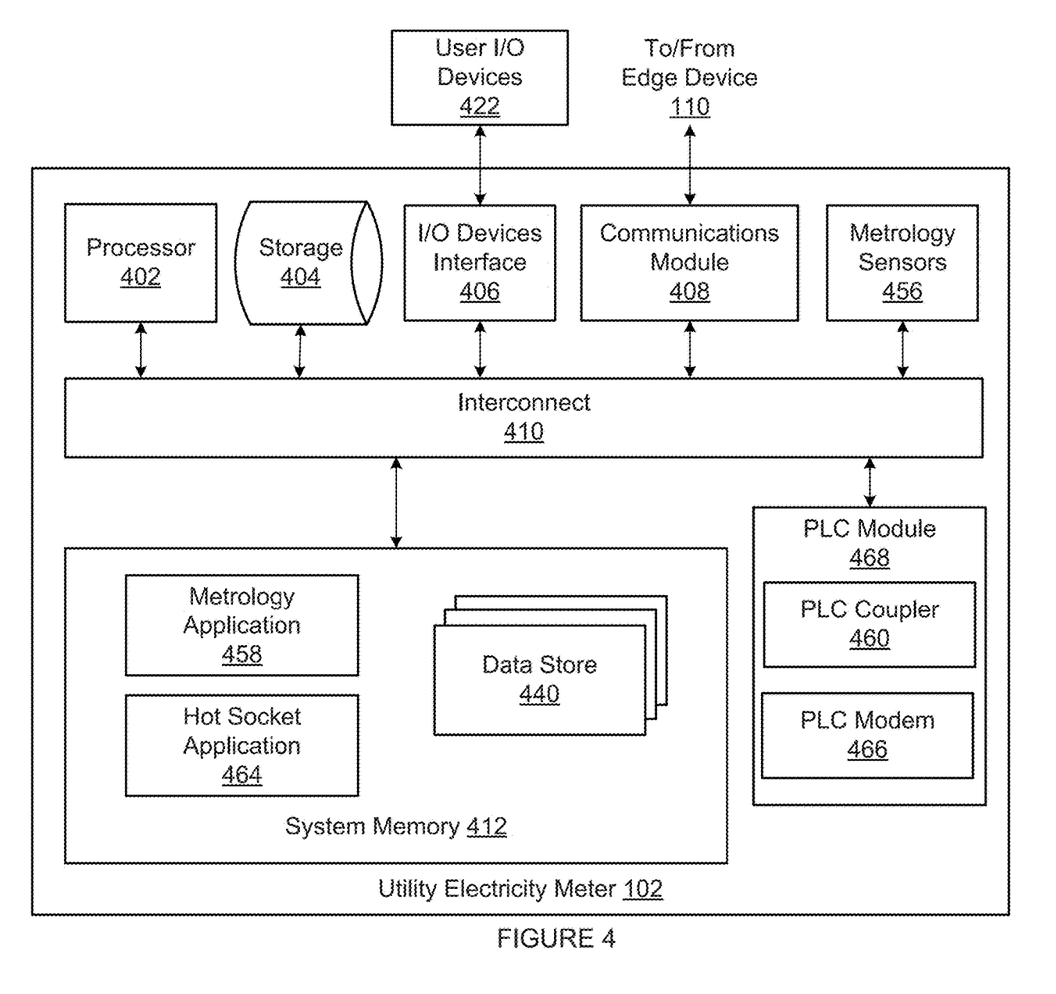
FIG. 4 illustrates a block diagram of the utility electricity meter of FIGS. 1-3, according to various embodiments.

FIG. 4 illustrates a block diagram of the utility electricity meter 102 of FIGS. 1-3, according to various embodiments.

As shown, the utility electricity meter 102 includes, without limitation, a processor 402, storage 404, an input/output (I/O) device interface 406, a communications module 408, an interconnect 410, and a system memory 412. The utility electricity meter 102 further includes, without limitation, metrology sensors 456 and a PLC module 468.

In general, processor 402 retrieves and executes programming instructions stored in system memory 412. Typically, processor 402 includes one or more digital signal processor (DSPs). More generally, processor 402 may be any technically feasible form of processing device configured to process data and execute program code. Processor 402 could be, for example, a central processing unit (CPU), a DSP, a graphics processing unit (GPU), an application-specific integrated circuit (ASIC), a field-programmable gate array (FPGA), and/or the like. Processor 402 stores and retrieves application data residing in the system memory 412. Processor 402 is included to be representative of a single processor, multiple processors, a single processor having multiple processing cores, and the like. In operation, processor 402 is the master processor of utility electricity meter 102, controlling and coordinating operations of other system components. System memory 412 stores software applications and data for use by processor 402. Processor 402 executes software applications, also referred to herein as software application programs, stored within system memory 412 and optionally an operating system. In particular, processor 402 executes software and then performs one or more of the functions and operations set forth in the present application.

The storage 404 may be a disk drive storage device. Although shown as a single unit, the storage 404 may be a combination of fixed and/or removable storage devices, such as fixed disc drives, floppy disc drives, tape drives, removable memory cards, or optical storage, network attached storage (NAS), or a storage area-network (SAN). In some embodiments, the utility electricity meter 102 may not include storage 404. In such embodiments, processor 402 stores data in and retrieve data from dynamic random access memory (DRAM), flash memory, and the like. Processor 402 communicates to other computing devices and systems via communications module 408. The communications module 408 is configured to transmit and receive data via a communications network, such as network 112, via the edge device 110 and/or one or more other utility electricity meters 102.

The communications module 408 may include hardware and/or software components to enable one or multiple different modes of communication. Software components included in the communications module 408 may include, without limitation, a software defined radio, drivers, libraries, applications, and plugins. These software components are stored in system memory 412 and executable or accessible by the processor 402. Additionally, in some embodiments, the communications module 408 may include one or more of dedicated processors and/or memory.

In some embodiments, the communications module 408 may include an RF transceiver configured to transmit and/or receive RF signals via one or more channels or frequencies. The transceiver may include an RF front end and a baseband processor or a software defined radio. In some implementations, each of the utility electricity meters 102 includes a single radio configured to send and receive data on multiple different channels, such as a control channel and multiple data channels of each communication link. The RF transceiver may also be configured to implement a plurality of different modulation techniques, data rates, protocols, signal strengths, and/or power levels. Additionally or alternatively, the communications module 408 includes a cellular or wide area network (WAN) module, or other communication software and/or hardware to facilitate communication with other devices in the utility communication network 114.

The interconnect 410 facilitates transmission, such as of programming instructions and application data, between the processor 402, input/output (I/O) devices interface 406, storage 404, communications module 408, system memory 412, metrology sensors 456, and PLC module 468. The I/O devices interface 406 is configured to receive input data from user I/O devices 422. Examples of user I/O devices 422 may include one of more buttons, a keyboard, a mouse or other pointing device, and/or the like. The I/O devices interface 406 may also include an audio output unit configured to generate an electrical audio output signal, and user I/O devices 422 may further include a speaker configured to generate an acoustic output in response to the electrical audio output signal. Another example of a user I/O device 422 is a display device that generally represents any technically feasible means for generating an image for display. For example, the display device may be a liquid crystal display (LCD) display, CRT display, or DLP display. The display device may be a TV that includes a broadcast or cable tuner for receiving digital or analog television signals.

The system memory 412 includes, without limitation, a metrology application 458, a hot socket application 464, and a data store 440. In operation, processor 402 executes the metrology application 458 and the hot socket application 464 to perform one or more of the techniques disclosed herein. Data store 440 may include various data structures retrieved by and/or stored by the metrology application 458 and the hot socket application 464.

In operation, the metrology application 458 executing on the utility electricity meter 102, and in conjunction with metrology sensors 456, senses and measures electricity consumption at the site 106. The metrology sensors 456 are representative of any of a variety of hardware and/or software usable to sense and measure electricity consumption data of the site 106.

In operation, the PLC module 468 enables the utility electricity meter 102 to communicate via PLC communications. In this regard, the PLC modules 468 acts as a PLC transceiver. The PLC module 468 is configured for communication with other utility electricity meters 102 and/or the edge device 110 in the utility communication network 114. At any given time, the PLC module 468 is in one of three states: (1) transmitting PLC message packets; (2) receiving and decoding PLC message packets; and (3) waiting for PLC message packets. The PLC module 468 spends the largest percentage of time in the third state, waiting for PLC message packets.

Similarly, the RF transceiver included in the communications module 408 enables the utility electricity meter 102 to communicate with other utility electricity meters 102 and/or the edge device 110 via RF communications. At any given time, the RF transceiver included in the communications module 408 is in one of three states: (1) transmitting RF message packets; (2) receiving and decoding RF message packets; and (3) waiting for RF message packets. The RF transceiver spends the largest percentage of time in the third state, waiting for RF message packets.

The hot socket application 464, in conjunction with the PLC circuitry and the RF circuitry, monitors, analyzes, and correlates, as a background process, the signals that are present in both the PLC spectrum and the RF spectrum. Correlated signals or noise that is present in both the PLC spectrum and the RF spectrum is indicative of a hot socket condition. The hot socket application 464 performs this analysis in order to detect hot socket conditions in parallel with waiting for PLC and RF message packets. The hot socket application 464 detects hot socket conditions via analysis of signal measurements taken at the utility electricity meter 102.

The PLC module 468 includes a PLC coupler 460 to connect the PLC module 468 to the electricity lines for communication. The hot socket application 464, when executing, interprets communications received by a PLC modem 466 and transmits outgoing communications via the PLC modem 466. The PLC modem 466 transmits and receives PLC communications over the circuit internal to the site 106. In some embodiments, the PLC modem 466 transmits and receives PLC communications over low, medium, and/or high-voltage power lines of the utility distribution network.

Messages transmitted via PLC include any technically feasible information, including, without limitation, a request to disconnect electricity service to the site, an alert of a potentially unsafe condition at the site, or a status notification. Based on the message, the utility electricity meter 102 performs some action, such as connecting electricity service to the site 106 or relaying the alert.

The hot socket application 464 engages the PLC module 468 to monitor and analyze samples via the PLC communications channel. Typically, the hot socket application 464 receives approximately two million PLC samples (e.g., voltage samples) per second. The hot socket application 464 acquires signal data and performs hot socket detection over multiple power cycles. The duration for each power cycle is 20 ms for 50 Hz power systems and 16.67 ms for 60 Hz systems.

More specifically, the hot socket application 464 receives PLC channel samples via the PLC modem 466 in the PLC module 468. When in communications mode, the PLC modem 466 performs analog-to-digital conversion (ADC) and demodulates signal data present on the power line and analyzes this signal data for an expected preamble which signifies the beginning of a message. In hot socket detection mode, the hot socket application 464 utilizes the same ADC to acquire signal data from PLC module 468. PLC communications typically involve modulation energy in the 1 kHz to 1 MHz range. In some embodiments, the PLC communications system operates in the 100 kHz to 500 kHz range. In general, PLC signal data is associated with conductive transmission over relatively large distance ranges.

Similarly, the hot socket application 464 engages the RF transceiver included in the communications module 408 to continuously monitor and analyze signal samples via the RF communications channel. Typically, the hot socket application 464 receives approximately two million RF samples per second from communications module 408. The hot socket application 464 acquires signal data and performs hot socket detection over multiple power cycles. RF communications typically involve modulation energy in licensed and/or license-free frequency bands in the sub-GHz frequency range. In general, RF channel data is associated with emitted transmission over relatively short distance ranges.

During the analysis, the hot socket application 464 records and analyzes the PLC signal data and the RF signal data over a period of multiple power cycles. The hot socket application 464 correlates and compares the PLC signal data and the RF signal data over an extended period of time to detect whether a hot socket condition is developing in the utility electricity meter 102. In one example, the hot socket application 464 detects signals in the PLC signal data that is indicative of electric arcing occurring somewhere in an associated electric circuit. If the hot socket application 464 does not detect corresponding signals in the RF signal data, then the correlation value is low, indicating that the source of the signals is located remotely from the utility electrical meter 102. Therefore, the hot socket application 464 determines that no hot socket condition is detected. This condition may occur when an outlet or device that is remote to the hot socket application 464 is experiencing an electric arcing condition.

In another example, the hot socket application 464 detects signals in the PLC signal data that is indicative of electric arcing occurring somewhere in an associated electric circuit. If the hot socket application 464 also detects corresponding signals in the RF signal data, then the correlation value is high, indicating that the source of the signals is located near to the utility electrical meter 102. Therefore, the hot socket application 464 determines that a hot socket condition is detected.

In yet another example, the hot socket application 464 detects signals in the PLC signal data that is indicative of message packets associated with PLC communications. Additionally or alternatively, the hot socket application 464 detects signals in the RF signal data that is indicative of message packets associated with RF communications. In general, message packets associated with PLC communications are not correlated with message packets associated with RF communications. Therefore, the correlation value is low, and the hot socket application 464 determines that no hot socket condition is detected when only these communications are present.

In some embodiments, the hot socket application 464 may detect patterns of correlations. In that regard, the hot socket application 464 may detect that a correlation between the first signal readings and the second signal readings, with a correlation value that exceeds a threshold value, occurs over multiple power cycles over a duration of time. The duration of time may be in the range of multiple seconds, multiple minutes, multiple hours, or longer. Additionally or alternatively, the hot socket application 464 may detect a pattern of repeated one or more correlations over the duration of time. In some examples, when more than a configurable percentage of power cycles or a configurable number of consecutive power cycles include a correlation value over a correlation threshold, the hot socket application 464 detects a hot socket condition. In some examples, when more than a configurable percentage of power cycles or a configurable number of consecutive power cycles include a correlation value over a correlation threshold that occurs at the same relative time within the respective power cycles, the hot socket application 464 detects a hot socket condition. In some examples, when more than a configurable percentage of power cycles or a configurable number of consecutive power cycles include a correlation value over a correlation threshold that occurs within a threshold duration of time from the most recent zero-crossing, the hot socket application 464 detects a hot socket condition.

In some embodiments, upon detecting a hot socket condition in the utility electricity meter 10, the hot socket application 464 performs one or more remedial operations. In one example, the hot socket application 464 could disconnect the electrical circuits within the site 106 from the electrical utility via a service disconnect (not shown), thereby disconnecting power from the site 106. In another example, the hot socket application 464 could transmit data regarding the hot socket condition via an edge device 110 to the central office 108 for analysis. The data could include a sample of the signal data and/or other relevant data. In yet another example, the hot socket application 464 could transmit a message to the central office 108 via an edge device 110. The message could include an alert to notify the central office 108 that the hot socket condition has been detected. The central office 108 could subsequently transmit a request for further information to the hot socket application 464 via the utility electricity meter 102. In response, the hot socket application 464 could transmit additional data regarding the hot socket condition, such as a sample of the signal data, to the central office 108 for analysis. In yet another example, the hot socket application 464 could transmit such data and/or an alert to other nearby utility electricity meters 102.

As described herein, the hot socket application 464, in conjunction with the PLC modem 466 and the RF transceiver in the communications module 408, typically senses sample data in the form of voltage data. However, in some embodiments, the hot socket application 464 may receive current data. In one particular example, the hot socket application 464 could receive current data from the metrology application 458 and/or metrology sensors 456. Similarly, the hot socket application 464 may receive current data in addition to the signal data received via the RF transceiver.

Figure 5A:
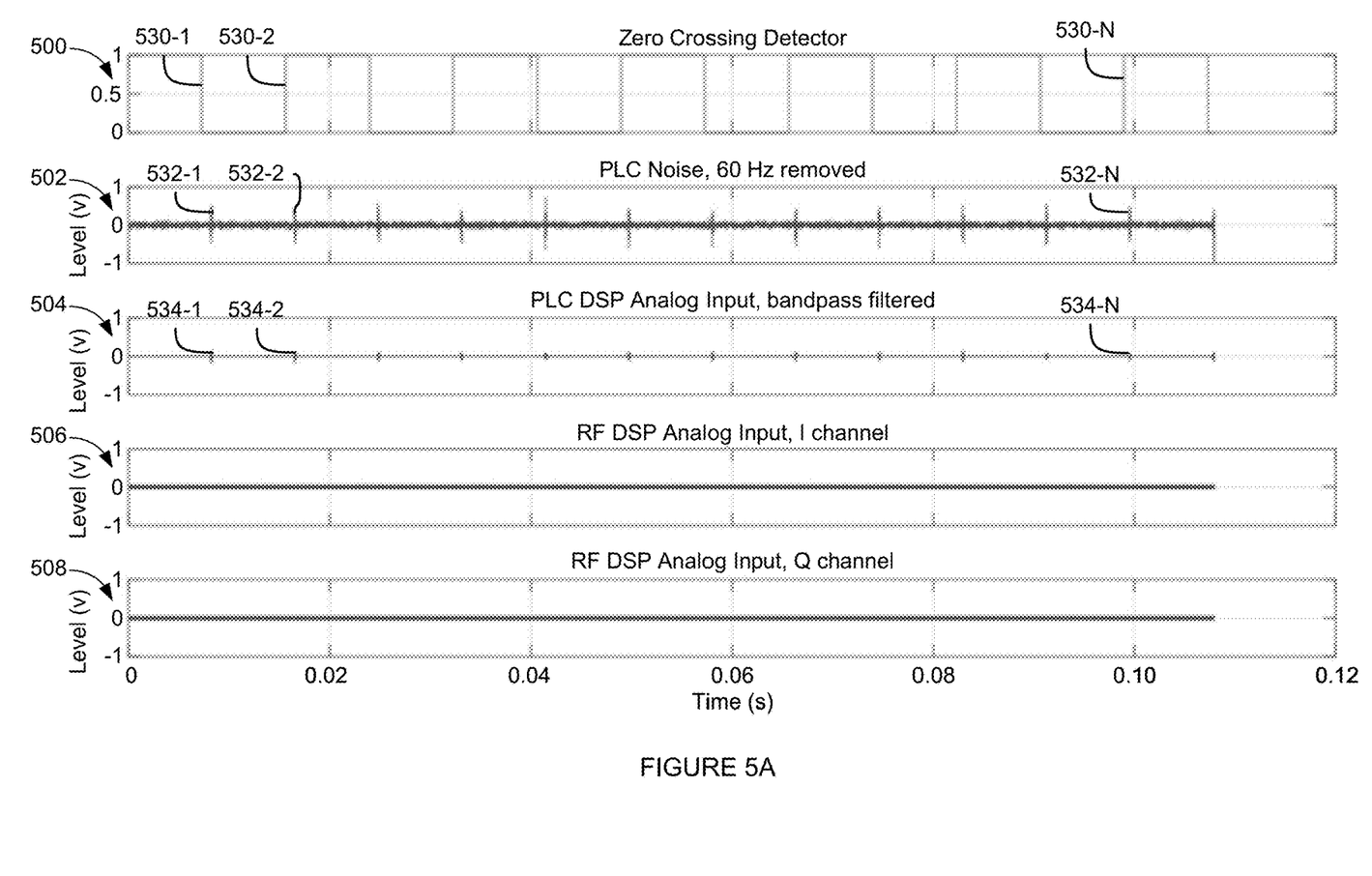
FIGS. 5A-5C illustrate waveforms characteristic of the hot socket conditions that can occur in one of the utility electricity meter sockets and utility electricity meters of FIGS. 1-3, according to various embodiments.
Figure 5B:
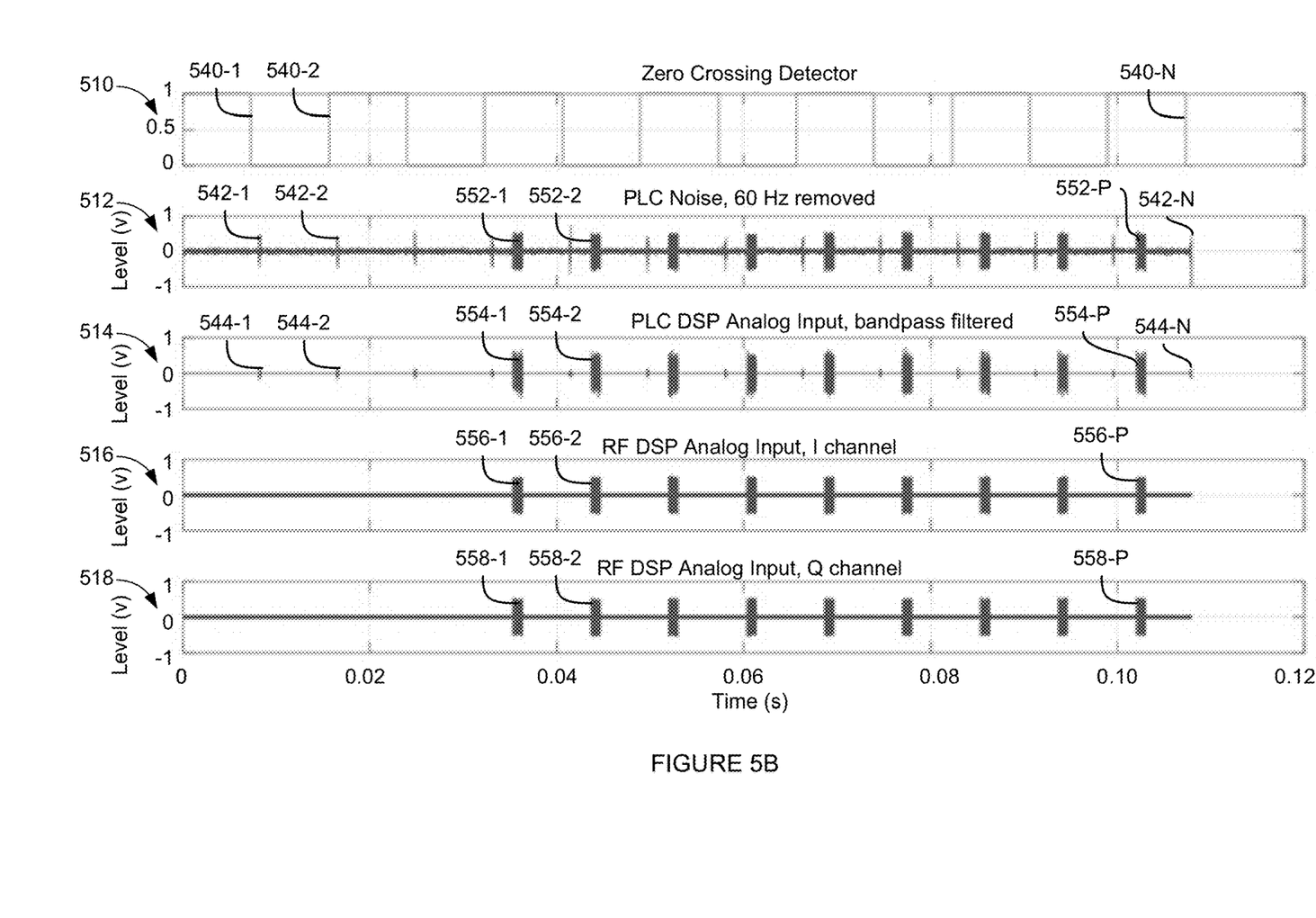
Figure 5C:
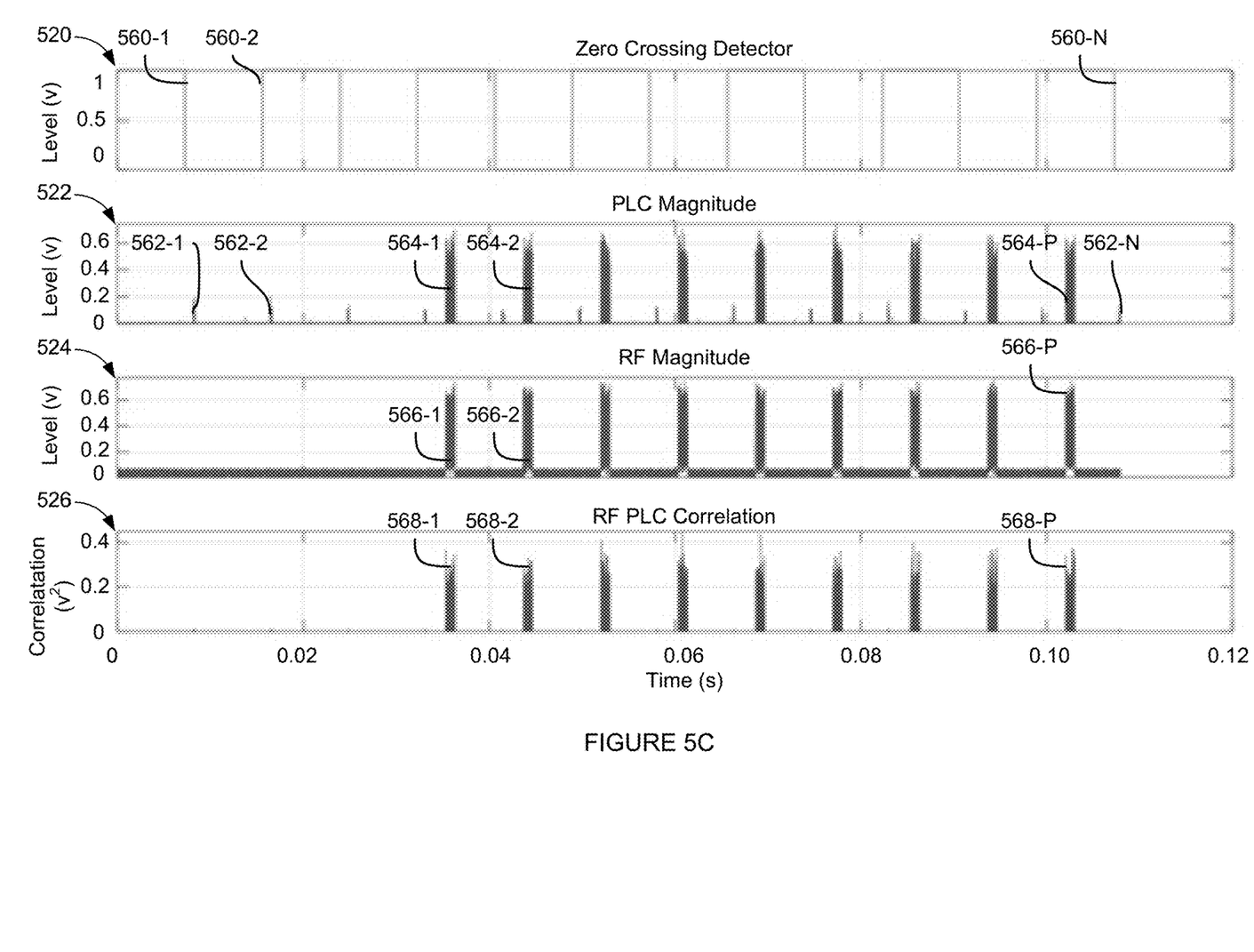

FIGS. 5A-5C illustrate waveforms characteristic of the hot socket conditions that can occur in one of the utility electricity meter sockets 104 and utility electricity meters 102 of FIGS. 1-3, according to various embodiments. As shown in FIG. 5A, the hot socket application 464 includes a zero-crossing detector that generates a waveform 500 of zero-crossing detections 530-1, 530-2 . . . 530-N at every zero-crossing, when the voltage at the utility electricity meter 102 is rising above the 0.0 V level or falling below the 0.0 V level. Waveform 502 illustrates the PLC signal after the carrier frequency, such as 60 Hz, has been removed. Waveform 504 illustrates the PLC signal after further filtering the PLC signal via a bandpass filter. Waveform 502 shows the presence of signals 532-1, 532-2 . . . 532-N occurring shortly after each zero-crossing. Similarly, waveform 504 shows the presence of signals 534-1, 534-2 . . . 534-N occurring shortly after each zero-crossing. These signals 532-1, 532-2 . . . 532 and 534-1, 534-2 . . . 534-N-N may be indicative of electrical arcing somewhere within the circuit associated with waveform 502 and waveform 504. Typically, signals 532-1, 532-2 . . . 532 and 534-1, 534-2 . . . 534-N-N indicate impulsive noise present on the power line. Additionally or alternatively, these signals 532-1, 532-2 . . . 532-N and 534-1, 534-2 . . . 534-N may be indicative of PLC communications message packets. Waveform 506 and waveform 508 illustrate the I channel and the Q channel, respectively, of the RF transceiver. Waveform 506 and waveform 508 may be indicative of a white noise or Gaussian signal. Because waveform 502 and waveform 504 show signals in the PLC channel occurring shortly after each zero-crossing, while waveform 506 and waveform 508 do not show correlated signals in the RF channel, the hot socket application 464 determines that a hot socket condition does not exist. The waveforms illustrated in FIG. 5A may be indicative of electrical arcing occurring within a circuit at a location remote from the utility electrical meter 102. Typically, these waveforms indicate impulsive noise present on the power line. Additionally or alternatively, waveforms illustrated in FIG. 5A may be indicative of PLC communications occurring within a circuit associated with the utility electrical meter 102.

As shown in FIG. 5B, the hot socket application 464 includes a zero-crossing detector that generates a waveform 510 of zero crossing detections 540-1, 540-2 . . . 540-N at every zero-crossing, when the voltage at the utility electricity meter 102 is rising above the 0.0 V level or falling below the 0.0 V level. Waveform 512 illustrates the PLC signal after the carrier frequency, such as 60 Hz, has been removed. Waveform 514 illustrates the PLC signal after further filtering the PLC signal via a bandpass filter. Waveform 512 shows the presence of signals 542-1, 542-2 . . . 542-N occurring shortly after each zero-crossing. Similarly, waveform 514 shows the presence of signals 544-1, 544-2 . . . 544-N occurring shortly after each zero-crossing. These signals 542-1, 542-2 . . . 542-N and 544-1, 544-2 . . . 544-N may be indicative of electrical arcing somewhere within the circuit associated with waveform 512 and waveform 514. Additionally or alternatively, these signals 542-1, 542-2 . . . 542-N and 544-1, 544-2 . . . 544-N may be indicative of PLC communications message packets. In addition, waveform 512 shows the presence of signals 552-1, 552-2 . . . 552-P occurring later within the cycle, well after the respective zero-crossing. Likewise, waveform 514 shows the presence of signals 554-1, 554-2 . . . 554-P occurring later within the cycle, well after the respective zero-crossing. These signals 552-1, 552-2 . . . 552-P and 554-1, 554-2 . . . 554-P may be indicative of electrical arcing and/or PLC communications message packets somewhere within the circuit associated with waveform 512 and waveform 514. Waveform 516 and waveform 518 illustrate the I channel and the Q channel, respectively, of the RF transceiver. Waveform 516 and waveform 518 may be indicative of a white noise or Gaussian signal. Note that PLC signals 554-1, 554-2 . . . 554-P are correlated with RF signals 556-1, 556-2 . . . 556-P and 558-1, 558-2 . . . 558-P with respect to magnitude and not phase. FIG. 5C, illustrating the magnitude and correlation of the signals shown in FIG. 5B, is now described.

As shown in FIG. 5C, the hot socket application 464 includes a zero-crossing detector that generates a waveform 520 of zero-crossing detections 560-1, 560-2 . . . 560-N at every zero-crossing, when the voltage at the utility electricity meter 102 is rising above the 0.0 V level or falling below the 0.0 V level. Waveform 522 illustrates the magnitude of the PLC signal after the carrier frequency, such as 60 Hz, has been removed. Waveform 524 illustrates the magnitude of the RF signal. Again, waveform 522 shows the presence of signals 562-1, 562-2 . . . 562-N occurring shortly after each zero-crossing that do not correspond to signals in waveform 524. Accordingly, the correlation value represented by waveform 526 is near zero at the time these signals 562-1, 562-2 . . . 562-N are present. These signals 562-1, 562-2 . . . 562-N may be indicative of typical impulsive noise present on the power line, electrical arcing, and/or PLC communications message packets somewhere within the circuit associated with waveform 522, but do not indicate a hot socket condition. In addition, correlated signals occur in both waveform 522 and waveform 524. In particular, waveform 522 shows the presence of signals 564-1, 564-2 . . . 564-P, while waveform 524 shows the presence of corresponding signals 566-1, 566-2 . . . 566-P. Accordingly, the correlation values 568-1, 568-2 . . . 568-P represented by waveform 526 is high at the time these correlated signals are present. Correlated signals occurring on both the PLC channel represented by waveform 522 and the RF channel represented by waveform 524 may be indicative of a hot socket condition.

Figure 6:
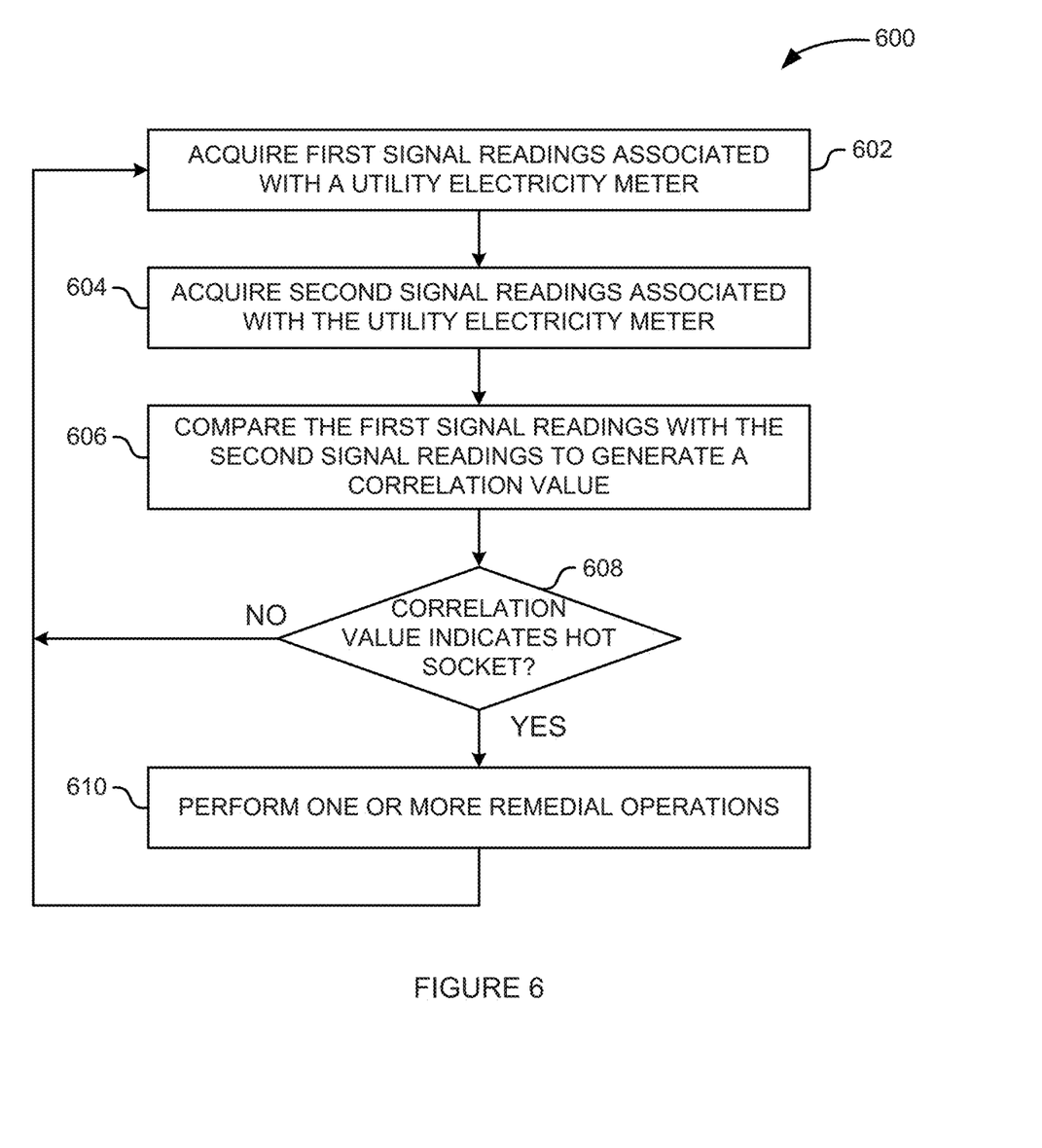
FIG. 6 is a flow diagram of method steps for detecting hot socket conditions in an electrical system, according to various embodiments.

FIG. 6 is a flow diagram of method steps for detecting hot socket conditions in an electrical system, according to various embodiments. Although the method steps are described in conjunction with the systems of FIGS. 1-5C, persons skilled in the art will understand that any system configured to perform the method steps in any order falls within the scope of the present invention.

The method 600 begins at step 602, where a hot socket application 464 executing on a utility electricity meter 102 acquires first signal readings constituting signal data associated a low-frequency PLC communications channel. In that regard, the hot socket application 464 acquires first signal readings in the PLC spectrum that represent signals that are within a first frequency range. The hot socket application 464 obtains the signal readings via power line communications components included in the utility electricity meter 102. These power line communications components include, without limitation, the PLC module 468 that further includes the PLC coupler 460 and the PLC modem 466. The PLC coupler 460 connects the PLC modem 466 to the line and/or neutral signals for communication. Examples of signal readings at the utility electricity meter 102 are exemplified by waveforms 502, 504, 512, 514, and 522 of FIGS. 5A-5C. In order to facilitate analysis of the electrical arcing signal, the PLC module voltage signal performs an analog-to-digital conversion to convert the analog signal into digital samples.

In some examples, the PLC module 468 applies a high-pass filter to either the analog signal or to the digital samples to remove the fundamental voltage frequency, typically 50 Hz or 60 Hz. In some examples, the PLC module 468 optionally applies a bandpass filter to either the analog signal or to the digital samples to remove additional noise data that is outside the frequency spectrum of interest for hot socket detection. After applying the high-pass filter and/or bandpass filter, only the electrical arcing signals and possibly some PLC communications signals remain, thereby further facilitating analysis of the electrical arcing signal, including hot socket conditions.

At step 604, the hot socket application 464 acquires second signal readings constituting signal data associated a high-frequency RF communications channel. In that regard, the hot socket application 464 acquires second signal readings in the RF spectrum that represent signals that are within a second frequency range, where the second frequency range is higher than the first frequency range of step 602. Examples of signal readings at the utility electricity meter 102 are exemplified by waveforms 506, 508, 516, 518, and 524 of FIGS. 5A-5C. In order to facilitate analysis of the hot socket signal, the RF transceiver included in the communications module 408 performs an analog-to-digital conversion to convert the analog signal into digital samples.

At step 606, the hot socket application 464 compares the first signal readings to the second signal readings to generate a correlation value. Examples of the correlation values are exemplified by waveform 526 of FIG. 5C. Correlated signals or noise that is present in both the PLC spectrum and the RF spectrum, which has a high correlation value in the magnitudes of the PLC and RF spectrum signals, is indicative of a hot socket condition.

At step 610, the hot socket application 464 determines whether the correlation value is indicative of a hot socket condition. In making this determination, the hot socket application 464 may use any technically feasible approach. In one example, the hot socket application 464 could determine that the correlation value is indicative of a hot socket condition if the correlation value exceeds a predetermined and/or configurable threshold level. In another example, the hot socket application 464 could determine that the correlation value is indicative of a hot socket condition if the correlation value exceeds a predetermined and/or configurable threshold level according to certain detected patterns.

More specifically, the hot socket application 464 may detect patterns of correlations between the first signal readings and the second signal readings over multiple power cycles over a duration of time. The duration of time may be in the range of multiple seconds, multiple minutes, multiple hours, or longer. Additionally or alternatively, the hot socket application 464 may detect a pattern of repeated one or more correlations over the duration of time. In some examples, when more than a configurable percentage of power cycles or a configurable number of consecutive power cycles include a correlation value over a correlation threshold, the hot socket application 464 detects a hot socket condition. In some examples, when more than a configurable percentage of power cycles or a configurable number of consecutive power cycles include a correlation value over a correlation threshold that occurs at the same relative time within the respective power cycles, the hot socket application 464 detects a hot socket condition. In some examples, when more than a configurable percentage of power cycles or a configurable number of consecutive power cycles include a correlation value over a correlation threshold that occurs within a threshold duration of time from the most recent zero-crossing, the hot socket application 464 detects a hot socket condition.

When the hot socket application 464 determines that the correlation value is not indicative of a hot socket condition, then the method 600 proceeds to step 602, described above. When the hot socket application 464 determines that the correlation value is indicative of a hot socket condition, then the method 600 proceeds to step 610, where the hot socket application 464 performs one or more remedial operations.

At step 610, the hot socket application 464 performs one or more remedial actions. In some examples, the hot socket application 464 could report the potential hot socket condition to the edge device 110, to a central server in a central office 108, and/or to one or neighboring utility electricity meters 102. In some examples, the hot socket application 464 could transmit a portion of the first signal readings and/or the second signal readings to the edge device 110, to a central server in a central office 108, and/or to one or neighboring utility electricity meters 102. In some examples, the hot socket application 464 could generate an alert to a user associated with the site 106 to inform the user of the hot socket condition. The hot socket application 464 could generate the alert via any one or more technically feasible mechanisms, including, without limitation, illuminating an indicator light on the utility electricity meter 102, generating an audio signal such as a siren, generating a computer simulated voice signal announcing the hot socket condition, transmitting a text message to the user, sending an email to the user, causing a smart speaker to inform the user of the hot socket condition, transmitting an alert message to a smart watch, and/or the like. In some examples, the hot socket application 464 could disconnect the electrical power to the site 106 to reduce or eliminate the likelihood of fire. After the hot socket application 464 performs the one or more remedial operations, the method 600 proceeds to step 602, described above.

As described herein, the hot socket application 464, in conjunction with the PLC module 468 and the RF transceiver included in the communications module 408, performs hot socket analysis concurrently with transmitting and receiving message packets associated with PLC communications and RF communications. Even so, in some embodiments, the method 600 may be suspended during PLC communications and/or RF communications. Therefore, the hot socket application 464 may temporarily suspend hot socket detection analysis when receiving and/or sending PLC messages and/or RF messages. In that regard, when performing hot socket detection analysis, the hot socket application 464 may detect PLC communications, such as a request to receive and/or transmit a message via the PLC modem 466. Similarly, hot socket application 464 may detect RF communications, such as a request to receive and/or transmit a message via the RF transceiver. In such cases, the hot socket application 464 suspends hot socket detection analysis prior to completion, switches to PLC and/or RF communications mode, and processes the PLC and/or RF communications. After processing the PLC and/or RF communications, the hot socket application 464 resumes the hot socket detection analysis mode. In this manner, the hot socket application 464 performs hot socket detection analysis with no disruption of PLC or RF communications.

In sum, a utility electricity meter is fitted with a PLC module for communications over line voltage and an RF transceiver to transmit and/or receive high-frequency RF signals. A hot socket application executing on a processor in the utility electricity meter continuously receives streams of signal samples via both the PLC module and the RF transceiver. The hot socket application compares and correlates the stream of signal samples received via the PLC module with the stream of signal samples received via the RF transceiver. A low correlation value may be indicative of noise, interference, and/or communication messages present on the PLC communications channel that are not present on the RF channel. Similarly, a low correlation value may be indicative of noise, interference, and/or communication messages present on the RF communications channel that are not present on the PLC channel. When the hot socket application detects a high correlation value and/or a pattern of high correlation values, the hot socket application determines that a broadband noise source is generating noise in both the PLC frequency spectrum and in the RF frequency spectrum. Such broadband noise is indicative of a hot socket condition.

In some examples, the hot socket application could report the potential hot socket condition to the edge device, to a central server in a central office, and/or to one or neighboring utility electricity meters. In some examples, the hot socket application 464 could transmit a portion of the first signal readings and/or the second signal readings to the edge device, to a central server in a central office, and/or to one or neighboring utility electricity meters. In some examples, the hot socket application could generate an alert to a user associated with the site to inform the user of the hot socket condition. The hot socket application could generate the alert via any one or more technically feasible mechanisms, including, without limitation, illuminating an indicator light on the utility electricity meter, generating an audio signal such as a siren, generating a computer simulated voice signal announcing the hot socket condition, transmitting a text message to the user, sending an email to the user, causing a smart speaker to inform the user of the hot socket condition, transmitting an alert message to a smart watch, and/or the like. In some examples, the hot socket application 464 could disconnect the electrical power to the site to reduce or eliminate the likelihood of fire.

At least one technical advantage of the disclosed techniques relative to the prior art is that hot socket conditions are detected with improved reliability relative to prior approaches. Because the disclosed techniques rely on detecting broadband noise, the techniques do not suffer from false positives resulting from temperature measurement approaches. Further, because the disclosed techniques involve detecting both PLC spectrum noise and RF spectrum noise, the techniques can distinguish hot socket conditions occurring at the utility electricity meter from arcing conditions occurring at other, more remote locations in the circuit. In particular, the magnitude of RF emissions produced by arcing is relatively low and becomes undetectable beyond a short distance from the utility electricity meter because of propagation loss. In addition, the disclosed techniques utilize existing PLC and RF circuitry along with relatively simple processing. Therefore, the techniques do not require specialized hardware or significant processing resources, such as is required to perform spectral and temporal analysis to detect RF signatures. These technical advantages represent one or more technological advancements over prior art approaches.

1. In some embodiments, a computer-implemented method for detecting hot socket conditions in an electrical system comprises: acquiring, via a power line communications (PLC) modem, first signal readings associated with a utility electricity meter; acquiring, via a radio frequency (RF) transceiver, second signal readings associated with the utility electricity meter; performing one or more operations on the first signal readings and the second signal readings to determine whether a hot socket condition is present; and performing a remedial operation in response to determining that the one or operations indicate that the hot socket condition is present.

2. The computer-implemented method according to clause 1, wherein the one or more operations comprise determining that a correlation between the first signal readings and the second signal readings is indicative of a hot socket condition.

3. The computer-implemented method according to clause 1 or clause 2, further comprising determining that the correlation between the first signal readings and the second signal readings exceeds a threshold value over multiple power cycles over a duration of time.

4. The computer-implemented method according to any of clauses 1-3, wherein the first signal readings represent signals that are within a first frequency range and the second signal readings represent signals that are within a second frequency range that is higher than the first frequency range.

5. The computer-implemented method according to any of clauses 1-4, wherein the remedial operation comprises disconnecting the utility electricity meter from an electrical utility via a service disconnect.

6. The computer-implemented method according to any of clauses 1-5, wherein the remedial operation comprises transmitting at least one of the first signal readings or the second signal readings to a central office, an edge device, or another utility electricity meter.

7. The computer-implemented method according to any of clauses 1-6, wherein the remedial operation comprises transmitting a first message to a central office, an edge device, or another utility electricity meter indicating that the hot socket condition has been detected.

8. The computer-implemented method according to any of clauses 1-7, wherein the remedial operation comprises generating an alert to inform a user of the hot socket condition.

9. The computer-implemented method according to any of clauses 1-8, wherein one or both of the first signal readings or the second signal readings comprise at least one of voltage readings or current readings.

10. In some embodiments, one or more non-transitory computer-readable media store program instructions that, when executed by one or more processors, causes the one or more processors to perform the steps of: acquiring, via a power line communications (PLC) modem, first signal readings associated with a utility electricity meter; acquiring, via a radio frequency (RF) transceiver, second signal readings associated with the utility electricity meter; performing one or more operations on the first signal readings and the second signal readings to determine whether a hot socket condition is present; and performing a remedial operation in response to determining that the one or operations indicate that the hot socket condition is present.

11. The one or more non-transitory computer-readable media according to clause 10, wherein the one or more operations comprise determining that a correlation between the first signal readings and the second signal readings is indicative of a hot socket condition.

12. The one or more non-transitory computer-readable media according to clause 10 or clause 11, further comprising determining that the correlation between the first signal readings and the second signal readings exceeds a threshold value over multiple power cycles over a duration of time.

13. The one or more non-transitory computer-readable media according to any of clauses 10-12, wherein the first signal readings represent signals that are within a first frequency range and the second signal readings represent signals that are within a second frequency range that is higher than the first frequency range.

14. The one or more non-transitory computer-readable media according to any of clauses 10-13, wherein the remedial operation comprises disconnecting the utility electricity meter from an electrical utility via a service disconnect.

15. The one or more non-transitory computer-readable media according to any of clauses 10-14, wherein the remedial operation comprises transmitting at least one of the first signal readings or the second signal readings to a central office, an edge device, or another utility electricity meter.

16. The one or more non-transitory computer-readable media according to any of clauses 10-15, wherein the remedial operation comprises transmitting a first message to a central office, an edge device, or another utility electricity meter indicating that the hot socket condition has been detected.

17. The one or more non-transitory computer-readable media according to any of clauses 10-16, wherein the remedial operation comprises generating an alert to inform a user of the hot socket condition.

18. The one or more non-transitory computer-readable media according to any of clauses 10-17, wherein one or both of the first signal readings or the second signal readings comprise at least one of voltage readings or current readings.

19. In some embodiments, a system comprises: a memory that includes instructions, and a processor that is coupled to the memory and, when executing the instructions, is configured to: acquire, via a power line communications (PLC) modem, first signal readings associated with a utility electricity meter; acquire, via a radio frequency (RF) transceiver, second signal readings associated with the utility electricity meter; perform one or more operations on the first signal readings and the second signal readings to determine whether a hot socket condition is present; and perform a remedial operation in response to determining that the one or operations indicate that the hot socket condition is present.

20. The system according to clause 19, wherein the one or more operations comprise determining that a correlation between the first signal readings and the second signal readings is indicative of a hot socket condition.

Any and all combinations of any of the claim elements recited in any of the claims and/or any elements described in this application, in any fashion, fall within the contemplated scope of the present invention and protection.

The descriptions of the various embodiments have been presented for purposes of illustration but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method, or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods, and computer program products according to various embodiments of the present invention of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method comprising:
    acquiring, via a power line communications (PLC) modem, first signal readings for one or more first signals within a first frequency range that are associated with a utility electricity meter;
    acquiring, via a radio frequency (RF) transceiver, second signal readings for one or more second signals within a second frequency range that are associated with the utility electricity meter;
    performing one or more operations on the first signal readings and the second signal readings to determine whether a hot socket condition is present; and
    performing a remedial operation in response to determining that the one or more operations indicate that the hot socket condition is present.

2. The computer-implemented method of claim 1, wherein the one or more operations comprise determining that a correlation between the first signal readings and the second signal readings is indicative of the hot socket condition.

3. The computer-implemented method of claim 2, further comprising determining that the correlation between the first signal readings and the second signal readings exceeds a threshold value over multiple power cycles over a duration of time.

4. The computer-implemented method of claim 1, wherein the second frequency range is higher than the first frequency range.

5. The computer-implemented method of claim 1, wherein the remedial operation comprises disconnecting the utility electricity meter from an electrical utility via a service disconnect.

6. The computer-implemented method of claim 1, wherein the remedial operation comprises transmitting at least one of the first signal readings or the second signal readings to a central office, an edge device, or another utility electricity meter.

7. The computer-implemented method of claim 1, wherein the remedial operation comprises transmitting a first message to a central office, an edge device, or another utility electricity meter indicating that the hot socket condition has been detected.

8. The computer-implemented method of claim 1, wherein the remedial operation comprises generating an alert to inform a user of the hot socket condition.

9. The computer-implemented method of claim 1, wherein one or both of the first signal readings or the second signal readings comprise at least one of voltage readings or current readings.

10. One or more non-transitory computer-readable media storing program instructions that, when executed by one or more processors, causes the one or more processors to perform the steps of:
    acquiring, via a power line communications (PLC) modem, first signal readings for one or more first signals within a first frequency range that are associated with a utility electricity meter;
    acquiring, via a radio frequency (RF) transceiver, second signal readings for one or more second signals within a second frequency range that are associated with the utility electricity meter;
    performing one or more operations on the first signal readings and the second signal readings to determine whether a hot socket condition is present; and
    performing a remedial operation in response to determining that the one or more operations indicate that the hot socket condition is present.

11. The one or more non-transitory computer-readable media of claim 10, wherein the one or more operations comprise determining that a correlation between the first signal readings and the second signal readings is indicative of the hot socket condition.

12. The one or more non-transitory computer-readable media of claim 11, further comprising determining that the correlation between the first signal readings and the second signal readings exceeds a threshold value over multiple power cycles over a duration of time.

13. The one or more non-transitory computer-readable media of claim 10, wherein
    the second frequency range is higher than the first frequency range.

14. The one or more non-transitory computer-readable media of claim 10, wherein the remedial operation comprises disconnecting the utility electricity meter from an electrical utility via a service disconnect.

15. The one or more non-transitory computer-readable media of claim 10, wherein the remedial operation comprises transmitting at least one of the first signal readings or the second signal readings to a central office, an edge device, or another utility electricity meter.

16. The one or more non-transitory computer-readable media of claim 10, wherein the remedial operation comprises transmitting a first message to a central office, an edge device, or another utility electricity meter indicating that the hot socket condition has been detected.

17. The one or more non-transitory computer-readable media of claim 10, wherein the remedial operation comprises generating an alert to inform a user of the hot socket condition.

18. The one or more non-transitory computer-readable media of claim 10, wherein one or both of the first signal readings or the second signal readings comprise at least one of voltage readings or current readings.

19. A system, comprising:
    a memory that includes instructions, and
    a processor that is coupled to the memory and, when executing the instructions, is configured to:
        acquire, via a power line communications (PLC) modem, first signal readings for one or more first signals that within a first frequency range that are associated with a utility electricity meter;

acquire, via a radio frequency (RF) transceiver, second signal readings for one or more second signals within a second frequency range that are associated with the utility electricity meter;

perform one or more operations on the first signal readings and the second signal readings to determine whether a hot socket condition is present; and perform a remedial operation in response to determining that the one or more operations indicate that the hot socket condition is present.

20. The system of claim 19, wherein the one or more operations comprise determining that a correlation between the first signal readings and the second signal readings is indicative of the hot socket condition.

* * * * *